United States Patent
Cho et al.

(10) Patent No.: US 8,882,983 B2
(45) Date of Patent: Nov. 11, 2014

(54) EMBEDDED THIN FILMS

(75) Inventors: Junghyun Cho, Vestal, NY (US); Bahgat Sammakia, Binghamton, NY (US); Mark D. Poliks, Vestal, NY (US); Roy Magnuson, Endicott, NY (US); Biplab Kumar Roy, Johnson City, NY (US)

(73) Assignee: The Research Foundation for The State University of New York, Binghamton, NY (US)

( * ) Notice: Subject to any disclaimer, the term of this patent is extended or adjusted under 35 U.S.C. 154(b) by 1140 days.

(21) Appl. No.: 12/482,202

(22) Filed: Jun. 10, 2009

(65) Prior Publication Data
US 2009/0301770 A1 Dec. 10, 2009

Related U.S. Application Data

(60) Provisional application No. 61/060,443, filed on Jun. 10, 2008, provisional application No. 61/087,165, filed on Aug. 7, 2008.

(51) Int. Cl.
C25D 9/08 (2006.01)
C25D 5/48 (2006.01)
H05K 1/16 (2006.01)
H05K 3/18 (2006.01)

(52) U.S. Cl.
CPC .. *C25D 9/08* (2013.01); *C25D 5/48* (2013.01); *H05K 2201/0355* (2013.01); *H05K 1/162* (2013.01); *H05K 2203/135* (2013.01); *H05K 2201/0175* (2013.01); *H05K 2203/092* (2013.01); *H05K 3/184* (2013.01)
USPC .......................................... 205/333; 205/316

(58) Field of Classification Search
USPC .................. 205/118, 333, 538, 542
See application file for complete search history.

(56) References Cited

U.S. PATENT DOCUMENTS 3,273,033 A * 9/1966 Rossmeisl ...................... 361/313
4,318,795 A * 3/1982 Bianchi et al. ................. 205/532

(Continued)

FOREIGN PATENT DOCUMENTS

JP 11172489 A * 6/1999

OTHER PUBLICATIONS

Kajiyoshi et al. (Preparation of Tetragonal Barium Titanate Thin Film on Titanium Metal S Kajiyoshi et al. Kajiyoshi et al. Ubstrate by Hydrothermal Method, J. Am. Ceram. Soc., 74 (2), 369-374, 1991).*

(Continued)

*Primary Examiner* — James Lin
*Assistant Examiner* — Ho-Sung Chung
(74) *Attorney, Agent, or Firm* — Steven M. Hoffberg; Ostrolenk Faber LLP

(57) ABSTRACT

A method for forming a film on a conductive substrate, comprising immersing a substrate having a conductive portion in a solution comprising a metal ion ceramic precursor for the film and a peroxide; applying a voltage potential to the conductive portion with respect to a counter electrode in the solution, sufficient to protect the conductive portion from corrosion by the solution, and drive formation of a film on the substrate, controlling a pH of the solution while limiting a production of hydrogen by electrolysis of the solution proximate to the conductive portion; and maintaining the voltage potential for a sufficient duration to produce a film on the conductive portion. An electrode may be formed over the film to produce an electrical device. The film may be, for example, insulating, dielectric, resistive, semiconductive, magnetic, or ferromagnetic.

31 Claims, 13 Drawing Sheets

(56) References Cited

U.S. PATENT DOCUMENTS

| | | | |
|---|---|---|---|
| 5,328,718 A * | 7/1994 | Abe et al. | 427/126.3 |
| 6,030,517 A * | 2/2000 | Lincot et al. | 205/333 |
| 6,261,433 B1 * | 7/2001 | Landau | 205/96 |
| 6,503,382 B1 * | 1/2003 | Bartlett et al. | 205/67 |
| 6,793,796 B2 * | 9/2004 | Reid et al. | 205/102 |
| 8,101,059 B2 * | 1/2012 | Jayaraman | 205/538 |
| 2002/0100693 A1 * | 8/2002 | Lu et al. | 205/157 |
| 2004/0099535 A1 * | 5/2004 | Schweinsberg et al. | 205/170 |
| 2005/0051434 A1 * | 3/2005 | Mishima et al. | 205/98 |
| 2007/0095657 A1 * | 5/2007 | Kim et al. | 204/290.12 |
| 2007/0148479 A1 * | 6/2007 | Ishikazi et al. | 428/469 |

OTHER PUBLICATIONS

Bendale et al. ("Preparation of Barium Titanate Film at 55° C by an Electrochemical Method," J. Am. Ceram. Soc., 76 (10), 2619-27, 1993).*

Sameh et al., Corrosion of Copper in Deaerated and Oxygenated 0.1 M H2SO4 Solutions under Controlled Conditions of Mass Transfer, Eng. & Tech. Journal, vol. 27, No. 5, 2009.*

Bunker, B.C., et al., "Ceramic thin-film formation on functionalized interfaces through biomimetic processing", Science, 264, 48 (1994).

Smith, R.K., et al., "Patterning self-assembled monolayers", Progress in Surface Science 75, 1-68 (2004).

* cited by examiner

EMBEDDED THIN FILMS

BACKGROUND OF THE INVENTION

1. Field of the Invention

The present invention relates, in general, to systems and methods for forming thin film structures on conductive surfaces, for example, printed circuit boards (PCBs), microelectromechanical (MEM) devices, sensors, and other structures.

2. Description of the Prior Art

As electronic circuit boards become crowded with numerous discrete components, additional advances will require utilization of the inner spaces of electronics packaging for embedded component placement. The embedding of the passive components inside packaging, circuit boards, and interconnections is starting to emerge in the industry as the process effectively combines manufacturing, component packaging and component assembly into a single manufacturing process flow. This embedded technology can thus achieve size reduction, increased functionality, improved high frequency performance, cost savings and increased reliability.

Typically, discrete chip resistors or discrete chip capacitors have been frequently mounted on most printed circuit boards (PCB), but, recently, PCBs are developing in which passive components, such as resistors or capacitors, are embedded.

A technology for fabricating the PCBs including the passive components embedded therein, achieves substitution of conventional chip resistors or chip capacitors by mounting the passive components, such as the resistors or capacitors, on an external surface of a PCB or in an internal layer of the PCB according to a process employing a formed dielectric or resistive material, such as a ceramic, carbon, or metal oxide powder, which may be mixed into an epoxy paste.

On the whole, the technology of fabricating a PCB including a capacitor or resistor embedded therein may be classified into three methods. A first method of fabricating a polymer thick film type of circuit elements applies a filled polymer paste, which is then thermally hardened (dried or cured) to fabricate a device. In this method, after the filled device, typically a capacitor, is applied on an internal layer of a PCB and dried, a copper paste is printed on the resulting PCB and dried so that electrodes are formed, thereby making an embedded device.

A second method is to apply a filled photosensitive resin on a PCB to fabricate a discrete type of device. The photosensitive resin which contains a filler powder is applied on the printed circuit board (PCB), and a copper foil is laminated on the resulting PCB to form upper and lower electrodes, a circuit pattern is formed, and the photosensitive resin is etched to fabricate the discrete type of device.

A third method provides an electrochemically deposited film or film precursor layer on a substrate, typically a copper trace or pad, to form a functional film thereon, typically a dielectric layer of a capacitor. The electrochemical process, however, is associated with a corrosive and hostile environment to the underlying conductor, e.g., copper, leading to suboptimal properties of the resulting device. In particular, the environment during the deposition or a post-deposition conversion process may be oxidizing, resulting in corrosion of the copper or other metal and reaction with solutes, and hydrolysis of the aqueous solvent and generation of hydrogen, resulting in embrittlement of the metal and/or separation of the conductor from its substrate. The hydrolysis also results in energy inefficiency.

In some cases, an electrochemical process leads to a protective coating which is non-conductive, and is thus self-limiting with respect to the conduct of an electrochemical process through the coating. Therefore, such processes are typically limited to thin protecting coatings (e.g., an anodization process to produce a protective oxide). Formation of coatings of arbitrary thickness is difficult, and the coatings may have properties which are limited by the process conditions, and not as an independently controlled factor over a range of thicknesses.

Therefore, the electrochemical formation of coatings on conductive surfaces are disfavored as compared to deposited thick films for the fabrication of embedded devices.

Studies known in the art have demonstrated that insertion of an additional layer having a capacitance or resistance or other desirable property in an internal layer of a PCB so as to substitute for a decoupling capacitor or termination resistor, for example, conventionally mounted on a surface of a PCB, can have advantageous properties, often owing to a reduction in parasitic effects and inductance.

SUMMARY OF THE INVENTION

The present systems and methods provide an electrochemical process for coating a conductive surface with a ceramic or insoluble or low solubility metal salt. This coating may be porous, and therefore formed with a range of thickness. The process reduces hydrolytic generation of hydrogen while avoiding corrosive conditions at the cathode.

According to one embodiment, ceramic thin films of high capacitance (i.e., high dielectric strength) materials are embedded within the inner layers of electronic packages or circuit boards and replace the need for placement and assembly operations of discrete surface mounted components. The ceramic films have the following advantages over existing ceramic-filled epoxy or ceramic paste dielectrics or conductors:

- In-situ deposition procedure in aqueous solution (e.g., no need for ceramic/polymer mixing);
- Better dielectric performance (e.g., higher dielectric constant and strength) for capacitors;
- Very low processing temperatures (<100° C.) and post-annealing temperatures (<200° C.);
- Tunable dielectric constant (through thickness and microstructure controls); and
- Micro-patterning capability.

In order to utilize the ceramic film as a device layer between electrode layers which are typically formed of copper, the ceramic films are nanostructured and preferably have a well controlled resistivity and well controlled dimensions, while still withstanding high voltages, e.g., >15 volts, to provide appropriate characteristics.

For this purpose, a preferred embodiment provides a three-ply (tri-layer) system consisting of a top copper layer (thin film), an intermediate dielectric, conductor or semiconductor, and a bottom copper layer (foil), which is formed by a process as shown in FIG. 1. In a capacitive embodiment, $TiO_2$ or $BaTiO_3$ are preferably used as a dielectric layer. On the other hand, in many cases, a resistor should have low capacitance, and therefore the material is selected as appropriate. For example, zinc oxide, indium oxide and tin oxide are both known resistor materials. As will become apparent below, oxides are preferred; however, other chemistries for dielectrics, conductors or semiconductors may be employed with appropriate modification of the process.

The copper foil is typically electrochemically treated to have an extremely smooth surface to accommodate a device layer. However, in some cases, it may be microstructured to increase surface area, and thus, for example, provide a resulting device with increased capacitance.

Production of ceramic thin films on the surface of copper foil may be enhanced through use of a "biomimetic" process. Formation of the ceramic thin films may, for example, be aided by organic self-assembled molecules (SAM) (for example, $C_{12}H_{29}O_6PSi$) that are primed on the copper foil which is formed on a substrate. The SAM layer, however, is not required to produce functioning capacitors or resistors. In the case of semiconductors, the SAM layer may be employed to control or alter a crystalline property or state of the layer formed above.

The preferred resultant microstructure, in the case of a thin film capacitor consists of 5-10 nm nanocrystallites assembled into a uniform film that are all connected via a very strong attractive force, without need for further densification, due to their small sizes. The thickness of the dielectric layer can be a range of submicron to a few microns. This unique thin microstructure is a basis of high dielectric constant due to continuous dielectric paths while the resultant high interfacial areas, and the nanoporosities provide a means of withstanding a large electric field without breakdown. The thicknesses as well as the amount/size of porosities may be controlled to achieve the optimum dielectric constant and strength. This offers the possibility of embedded capacitors with tunable dielectric properties.

In the case of a resistor, a relatively thick film may be desired to achieve an appropriate resistance, voltage and power handling capability.

As will become apparent below, the film need not be homogeneous, and may, for example, be layered during deposition, or modified after initial deposition of a precursor layer. The film is typically an oxide or relatively insoluble (in water) salt of a metal, though the technique is not so limited, and may, for example, be used with respect to organic conductors and materials. Likewise, the substrate need not be copper, and may be any surface which is sufficiently conductive to permit the electrochemical processing. For example, the electrodes of a device may be formed from carbon nanotubes (CNT) or other conductive nanofibers, organic conductors or semiconductors, or the like. The process conducts the film forming process under conditions which sufficiently alter the microenvironment of the electrode to avoid undesired corrosion or other effects. In particular, the electrochemical potential of the surface and local pH are maintained within a desired range, by, for example, applying a voltage potential to the conductive surface with respect to a reference electrode, and using a pH control for the bulk solution which achieves a desired pH, during processing, in proximity to the surface. It is noted that the chemical process may itself induce pH changes at the surface, and therefore the pH of the bulk solution may differ from that near the surface. The control of the pH may be determined empirically, or through careful measurements proximate to the surface.

Other benefits from the materials and processes disclosed herein include an in-situ deposition process in aqueous solution. As a result, there is no need for preparation of ceramic or metal oxide or metal nitride powders and their mixing with polymer, as with known alternate processes. It is noted that the present technology is not limited to planar surface processing per se, and therefore may be applied to bulk products, presumably having sufficient porosity to permit ionic flow of precursors and resultant soluble products.

SAM-assisted dielectric film formation permits patterning of the resulting dielectric films, since the film formation would selectively occur on the areas that have specific SAM functional groups. SAM may also be useful for forming resistive films. The high degree of surface selectivity afforded by this functionalization can be achieved via e-beam photolithography, ion-beam photolithography, soft pad transfer lithography, ink jet lithography or the like. (B. C. Bunker et al., Science, 264, 48 (1994). In addition, the scanning probe approach can provide an alternate way for the dielectric film patterning. (R. K. Smith et al. Prog. Surf. Sci, 75, 1 (2004). In this approach, the SAM terminus is destroyed (desorbed), replaced, or reacted on direct contact with the AFM tip, thereby producing a binary pattern of treated and untreated SAM surfaces.

The process may be applied, for example, to embed dielectric films standard copper plated epoxy circuit boards, and may also be used to process polyimide substrate flexible circuit boards. Such films may be used, for example, as power supply decoupling capacitors, in transmission line termination circuits, in antennas and other controlled impedance devices and transmission lines, and as embedded sensors.

According to preferred implementation of a dielectric deposition, a titania based ceramic dielectric may be formed in an ionic solution of titanium chloride ($TiCl_4$). However, this solution is normally corrosive to the underlying copper electrode on which the dielectric is to be formed. For example, titania ($TiO_2$) films may be formed on commercial copper/FR4/copper laminates.

A corresponding process may be used to deposit a resistor material on the copper electrode, though typically, the salts will be different. Likewise, various dopants or impurities may be added to the solution (or provided in a secondary transformation process) in order to achieve a film with the desired electrical properties, for example, to provide a thermistor or embedded positive coefficient thermal element to provide switching or adaptive current distribution.

The film produced may have optical properties of interest. For example, titanium oxide is photohydrolytically active, and when moist and subject to sufficient illumination, will produce hydrogen and oxygen, or oxidize various chemical species in the environment, for example organic substances. Therefore, if the titania film produced by a deposition process is left uncovered, or it covered with an optically transmissive (at the wavelengths of interest) layer, then it may be used hydrolyze water or oxidize materials when illuminated. Further, since a conductive electrode is present under the film, the structure may advantageously be used as a sensor, based, for example, on an electrical voltage or current produced by the structure, either without a bias voltage, or with respect to a reference electrode. A cyclic voltimetry sensor may be implemented, in which the reference voltage varies over time. The titania film may be chemically doped with selected impurities, and/or with particles that are incorporated into the macroscopic film. Titania also has antimicrobial properties under ultraviolet light.

A light source may be provided in or nearby the film. For example, an organic light emitting diode structure may be formed near the film, and also placed on or embedded in a circuit board or interconnect system. A normal light emitting diode may also be mounted in proximity. The film may also be illuminated by sunlight or external artificial light. Further, a light pipe structure, such as a fiber optic or optically transmissive layer integrated within the system, may convey a remote light source to the film.

Titania, or its derivatives, may also form part of an oxygen sensor, catalytic sensor, or act as catalyst for a chemical reaction.

One way to avoid the corrosion of the copper substrate by the hydrogen chloride formed by reaction of $TiCl_4$ with water in solution is to maintain an electrochemical potential of the copper at a level which prevents oxidation of the copper, for example, negative 5V, with respect to a reference in the solution. The copper film is this thus the cathode. However, an aqueous solution subject to this potential leads to hydrolysis, which both wastes energy and leads to evolution of hydrogen at the cathode, which may damage the metallic film and hinders formation of the ceramic layer. In this type of solution, water is reduced to $H_2$ at the cathode, $OH^-$ ions are formed, and the pH near the cathode consequently increases.

While maintaining this potential, one way to avoid electrolysis is to employ a hydrogen peroxide ($H_2O_2$) in a methanol-water mixture. $H_2O_2$ forms an electropositive complex with $Ti^{4+}$ ions in the solution. These complexes are attracted towards the cathode by the applied voltage, and due to the high pH, get converted to $TiO_2$ particles which are deposited onto the cathode. While the details may differ, other polyvalent metal ions may be subject to similar reactions.

On the other hand, the anode is subject to low pH. The anode, however, generally does not form part of the end product, and thus the low pH conditions are acceptable and can be tolerated. For example, the anode may be a corrosion resistant platinum electrode substantially displaced from the cathode, though other structures and materials may be used. This reaction generally proceeds at room temperature, and in any case elevated temperatures (e.g., >100° C.) are not generally required.

Therefore, in accordance with a preferred reaction, the underlying cathode electrode film, which forms part of the end product structure is cathodically protected from action of a potentially corrosive ceramic precursor, e.g., HCl, by an applied voltage with respect to a counter-electrode, which is, for example, a platinum electrode, and a peroxide in solution reacts with the ceramic precursor to produce the ceramic particles and film on the surface. Thus, the −5V potential at the cathode prevents corrosion of the copper by the chloride ion in solution. The involvement of hydrogen peroxide in the reaction reduces the generation of hydrogen gas which would result in its absence. Both the ceramic precursor and peroxide are consumed in the reaction, which is driven by the electrochemical potential applied between the conductive surface (copper film cathode) and reference electrode (platinum anode). These can be replenished during processing, or provided in sufficient excess in the bulk solution.

A preferred dielectric ceramic formed by the process is Titanium dioxide ($TiO_2$), and a preferred ceramic precursor is Titanium tetrachloride ($TiCl_4$). It is understood that the chloride cation is generally selected because it renders the precursor salt soluble, and that other soluble salts may be employed as desired, for example $TiBr_4$ or mixed salts. Likewise, since the cation generally is attracted to the anode, which is typically displaced from the cathode and typically does not form part of the end product, the basic system may be tolerant of different or additional cations. Likewise, the titanium anion is selected because of its desirable properties in forming the end product layer, and different anions may be employed alone or in combination as desired to product different end products, e.g., barium. The preferred hydrogen peroxide process results in a metal oxide ceramic layer. However, it will be readily apparent that through use of other solutions, alterations in the product may be achieved. Or example, use of an organic peroxide may result in an organometallic layer, or provide an environment suitable for secondary reactions with other cations to provide film products other than pure oxides. Thus, if other ions are present in solution, the resulting precipitated layer may be substituted with those ions, displacing the organic ligand. Likewise, after or during formation of an oxide, other chemical reactions may occur, altering or modifying the product.

The main chemical reactions in the preferred deposition of $TiO_2$ dielectric layer are as follows:

$$TiCl_4 + (n+2)H_2O_2 \rightarrow [Ti(O_2)(OH)_{n-2}]^{(4-n)+} + 4HCl + O_2$$

$$[Ti(O_2)(OH)_{n-2}]^{(4-n)+} + mOH^- + kH_2O \rightarrow TiO_3(H_2O)_x$$

$$TiO_3(H_2O)_x \rightarrow 2TiO_2 + O_2 + 2xH_2O$$

According to one embodiment, an initially deposited titanium oxide film may be further converted to a higher dielectric ceramic, such as barium titanate. For example, the titanium chloride solution may be replaced or supplemented with barium chloride, and the deposited titanium oxide electrochemically converted to barium titanate. By thermodynamic calculation, an optimum voltage range is determined for this electrochemical conversion, which lies in the stability range of water and under such conditions that the copper undergoes no considerable oxidation. At pH>12, a very low voltage (~0.5 V) may be applied to protect the copper from peeling off the film due to hydrogen evolution, while the conversion from titanium oxide to barium titanate progresses.

Thus, the control over pH and electrochemical potential may be employed not only during the initial process, but also during subsequent processing steps as may be desired.

Generally, in the case of a circuit board or the like, the electrical voltage may be applied to the surface through the normal conductive traces which form a part of the circuit. For example, capacitors are typically referenced to ground, and therefore the voltage may be applied to a ground plane during processing, with portions of the circuit not intended to be coated masked with a suitable material. Of course, in different circuit topologies, the layers may be formed on different traces. In some cases, a special trace to the conductor may be provided specifically to permit the control over electrochemical potential during processing, which may be left in the final product, or subject to a removal step. For example, if the trace is designed for this purpose, it may be corroded in a short process after deposition of the intended film, by operating under corrosive conditions, which, due to a difference in configuration (i.e., thickness, width, location, proximity to anode, electrochemical potential with respect to second anode, etc.) is differentially more sensitive to such conditions than the intended film. Typically, no such intentional corrosion is required, however, it remains an option, typically for post treatment. It is further noted that masking steps may be employed to selectively process traces or portions thereof.

It is therefore an object to provide a method of forming a film on a substrate having a conductive surface, comprising: immersing the substrate having the conductive surface in a solution, wherein the solution has at least one potentially reactive solute; applying a voltage potential on the conductive surface with respect to a counter electrode in the solution and controlling a composition of the solution, sufficient to thermodynamically protect the conductive surface from corrosion by the potentially corrosive solute, and to drive formation of the film on the conductive surface; and maintaining the voltage potential and composition of the solution to promote formation of the film while limiting at least one electrochemical reaction proximate to the conductive surface for a sufficient duration to produce a desired thickness of the film on the conductive surface.

Ir is a further object to provide an electrical apparatus, comprising: at least one conductive surface portion provided on a substrate, subject to corrosion by at least one component of solution of a film precursor; and a film, formed from a solution comprising the film precursor, deposited on the conductive surface portion, by applying a voltage potential to the conductive surface portion with respect to a counter electrode in the solution, and maintaining a composition of the solution, sufficient to thermodynamically protect the conductive surface portion from corrosion by the solution, and to drive formation of the film on the at least one conductive surface portion, while limiting at least one electrochemical reaction proximate to the at least one conductive surface portion.

It is a still further object to provide a method for forming an electrically functional film on a conductive substrate having a surface subject to corrosion by soluble metal salts, comprising: immersing a substrate having a conductive portion in a solution comprising an electrically functional film precursor and a peroxide; applying a voltage potential to the conductive portion with respect to a counter electrode in the solution and controlling a composition of the solution, sufficient to thermodynamically protect the conductive portion from corrosion by the solution, and drive formation of an electrically functional film on the conductive substrate, while limiting an electrochemical reaction proximate to the conductive portion; and maintaining the voltage potential and controlling the composition of the solution proximate to the conductive surface for a sufficient duration to produce a film on the conductive portion.

Another object provides a functional film of a resistor or semiconductor formed on a portion of a substrate having a surface subject to corrosion by soluble metal salt ceramic precursors, comprising: a substrate portion provided on the substrate; a resistive or semiconductive material formed from a solution comprising a metal ion source and a peroxide deposited on the substrate portion, by applying a voltage potential to the substrate portion with respect to a counter electrode in the solution, sufficient to protect the substrate portion from corrosion by the solution, and drive formation of a resistive or semiconductive material film on the substrate portion, while controlling a pH and limiting an electrochemical reaction proximate to the substrate portion; and a conductive portion formed sandwiching the resistive or semiconductive material film with respect to the substrate portion.

It is a further object to provide a method of converting a titania film to a barium titanate film, comprising: immersing a substrate having a titania film on conductive portion in a solution comprising a barium salt; and applying a sufficient voltage potential to the conductive portion with respect to a counter electrode in the solution, while maintaining a sufficiently high pH, to protect the conductive portion from corrosion by the solution, while limiting a production of hydrogen by hydrolysis proximate to the conductive portion, to thereby permit conversion of the titania film to a barium titanate film.

The conductive surface may comprises a metal, organic conductor, carbon nanotubes or other material subject to influence by the reaction chemistry. In a preferred embodiment, the conductive surface comprises metallic copper.

The film may comprise titanium dioxide, or another metal-oxide ceramic. The film may comprise at least one of tin, indium, zinc, and barium.

The solution may comprise a chloride or other halide ion. The solution may comprise an alcohol and water mixture, preferably with methanol, and preferably with hydrogen peroxide. The solution preferably comprises between about 50% and 95% methanol. A film precursor may comprise titanium chloride, which is added to the solution.

The conductive surface is typically cathodically protected by application of a negative bias voltage with respect to a reference electrode in solution and a pH of the solution proximate to the conductive surface is maintained.

The film may be, or be transformed into, a dielectric layer of a capacitor, a resistive layer, a semiconductor, a thermistor, a sensing layer or sensor, a catalyst, a photo-chemical layer, or other functional and/or protective film. The film may also serve aesthetic purposes. The initially formed film may be subjected to a chemical reaction to increase a dielectric constant of the film, or to otherwise change its physical and/or chemical properties. The transforming chemical reaction may comprise reacting the formed film with an ionic solution, while controlling a pH proximate to the formed film and a voltage potential of the conductive substrate with respect to a reference electrode in the solution. The formed film may comprise titanium oxide, subject to chemical reaction with an ionic solution which comprises barium, the film having increased dielectric constant comprising barium titanate.

A conductive layer may be formed over the film, to thereby sandwich the film between two conductors. Alternately, the upper and/or the lower layer may be insulating. For example, a portion of the conductive surface may be chemically modified to a non-conducting oxide after the film is formed. Likewise, a non-conducting layer may be formed over the film.

A self-assembling monolayer may be formed on the conductive surface to influence a deposition of the film.

The electrochemical reaction proximate to the conductive surface may comprise a hydrolytic production of hydrogen.

The film may be formed to thickness of greater than about 0.5 microns.

The process may be conducted under a maximum process temperature of less than about 100° C.

The voltage potential during the process of initially forming the film may be between about −5V and −10V, and may vary over time. The voltage potential may be applied, for example, for an aggregate of between about 20 and 140 s to form the film.

The thermodynamic protection preferably comprises maintaining an voltage potential and a pH proximate to the conductive surface within a range determined by thermodynamic analysis to maintain the conductive surface in a reduced state.

A portion of the conductive surface may be masked to selectively define a film deposition region. A series of film layers may be formed on the conductive surface.

The film may have, or be transformed to have, for example, a resistivity of between about 25 and 100 Ohms per square, a dielectric constant of at least 17, and/or a breakdown voltage of at least 15V.

EXPERIMENTAL RESULTS

Figure 1:
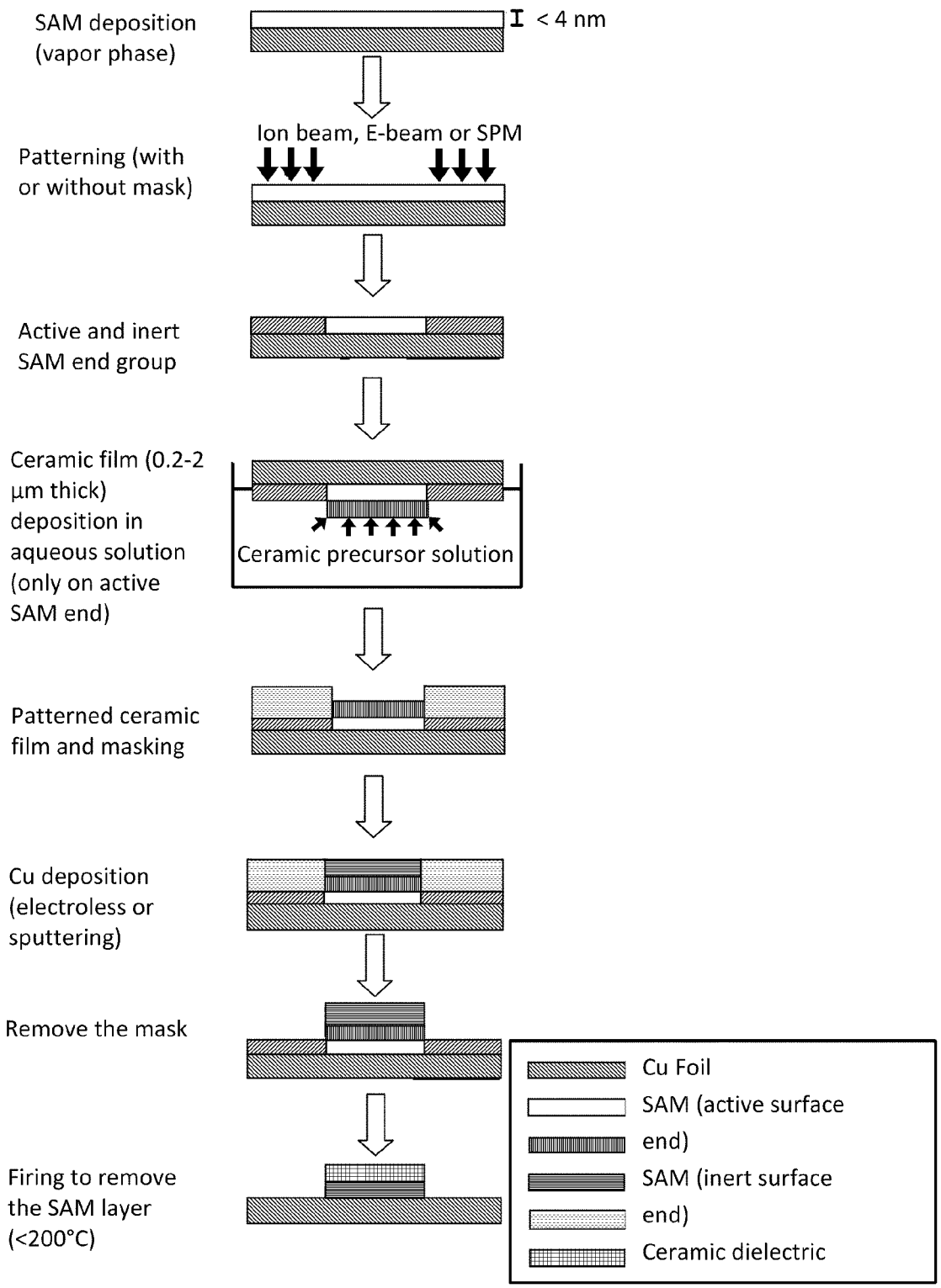
FIG. 1 shows a process flow for fabrication of an embedded capacitor for a system-in-package in accordance with the present invention.

FIG. 1 shows a process flow diagram for forming an embedded capacitor on a circuit board using an electrochemical deposition technique for the dielectric layer. In a first step, an optional self assembling monolayer (SAM) is deposited on a copper substrate using a vapor phase deposition technique. This layer is, for example, less than 4 nm thick. The optional SAM layer is then patterned using, for example, ion beam, e-beam or scanning probe microscopy (SPM) "scratching" of the SAM. The SAM is modified using a mask or direct write technique to provide macroscopic domains with active and inert end groups.

A ceramic film, for example having a thickness of 0.2-2.0 µm is selectively deposited over the active SAM end, to form a ceramic film on the active portion of the SAM on the copper substrate from a solution of $TiCl_4$-MeOH-$H_2O$-$H_2O_2$ under an electrochemical potential of about −5V.

The inactive portion of the SAM is then masked, for example using a UV curable mask, and an electroless plating method employed to deposit a copper electrode over the ceramic dielectric exposed through the mask. The mask is then stripped, and the structure can then be heated, for example to a temperature <200° C. to remove the optional SAM layer.

Figure 2:
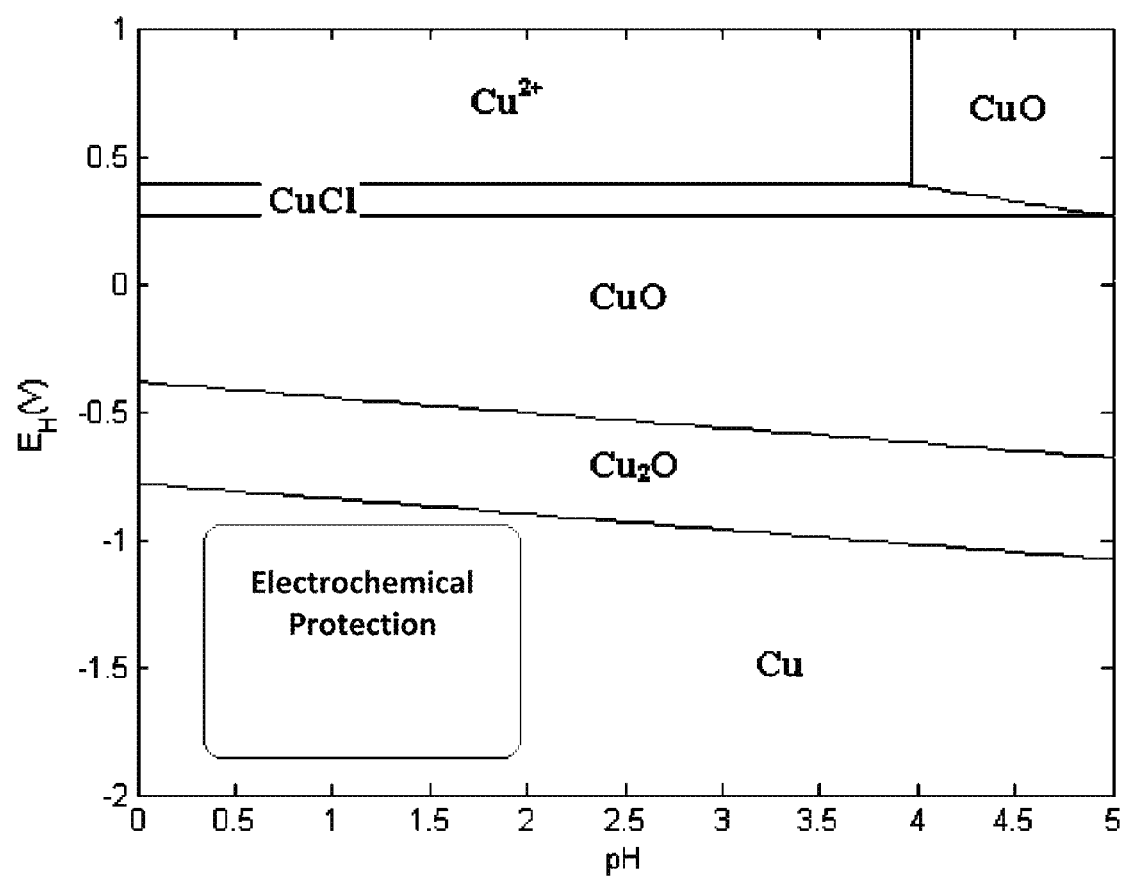
FIG. 2 shows an $E_H$-PH diagram of the Cu—Cl—$H_2O_2$—$H_2O$ system ([Cl$^-$]=0.005, [$H_2O_2$]=0.05M) showing a range available for electrochemical protection of a copper substrate.

FIG. 2 shows an $E_H$-pH diagram of the Cu—Cl—$H_2O_2$—$H_2O$ system with [$Cl^-$]=0.005 M and [$H_2O_2$]=0.05M. As shown in the drawing, a stable reduced region for the copper, providing electrochemical protection of the copper against corrosion, lies at an electrochemical potential more negative than 0.8-1.1V at pH between 0-5, with the required voltage increasing with increasing pH. Without electrochemical protection, the $TiCl_4$ is corrosive to the copper, and a potential of about −5V is suitable to drive the reaction while providing corrosion protection. At this potential, most of the energy is consumed in electrolysis of water. Further, hydrogen produced by the hydrolysis is evolved at the copper surface cathode, which hinders thin film deposition and can degrade the copper film.

Example 1

Figure 3A:
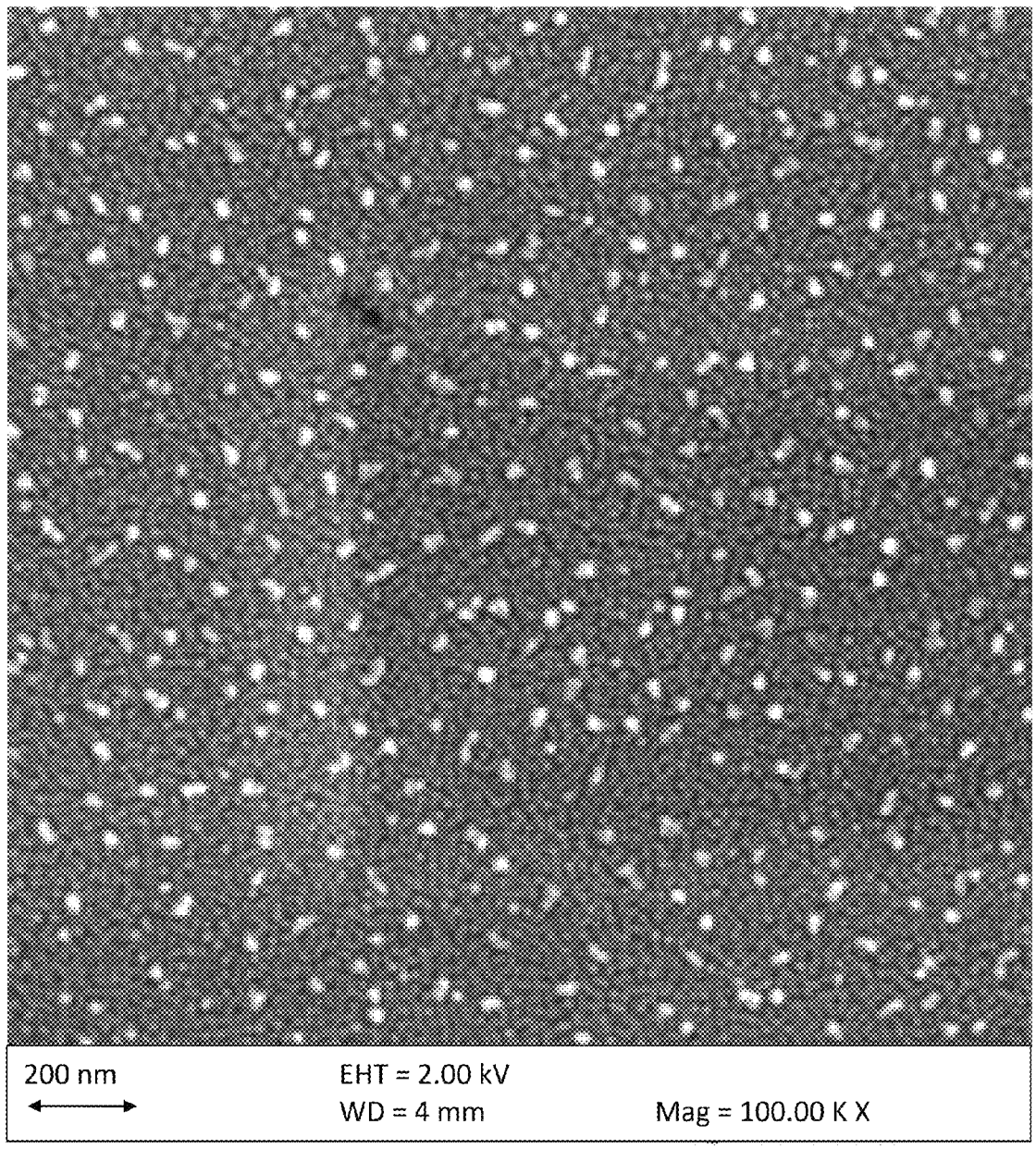
FIGS. 3A, 3B and 3C show electron micrographs of a 550 nm thick titania film under various magnifications.
Figure 3B:
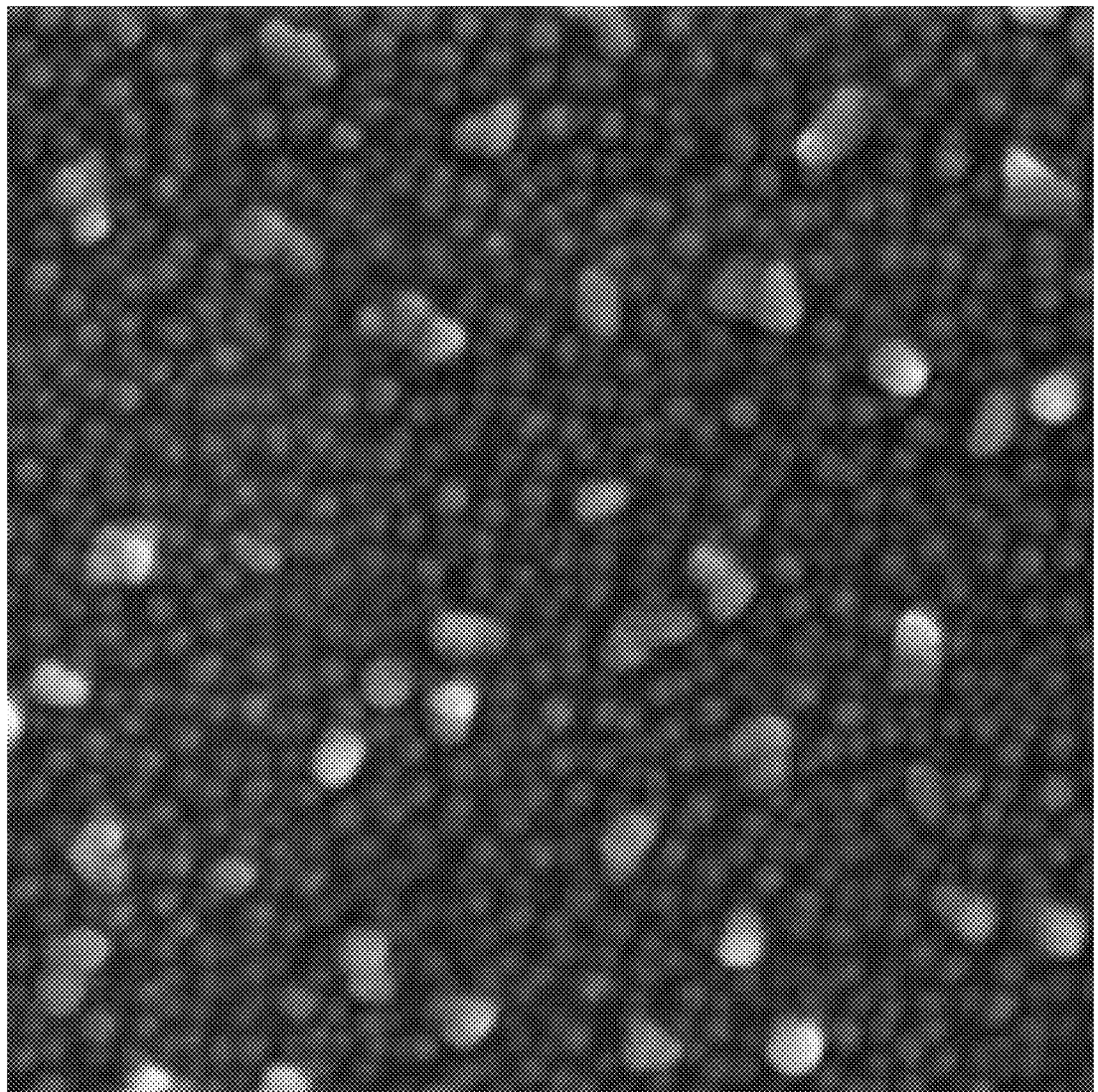
Figure 3C:
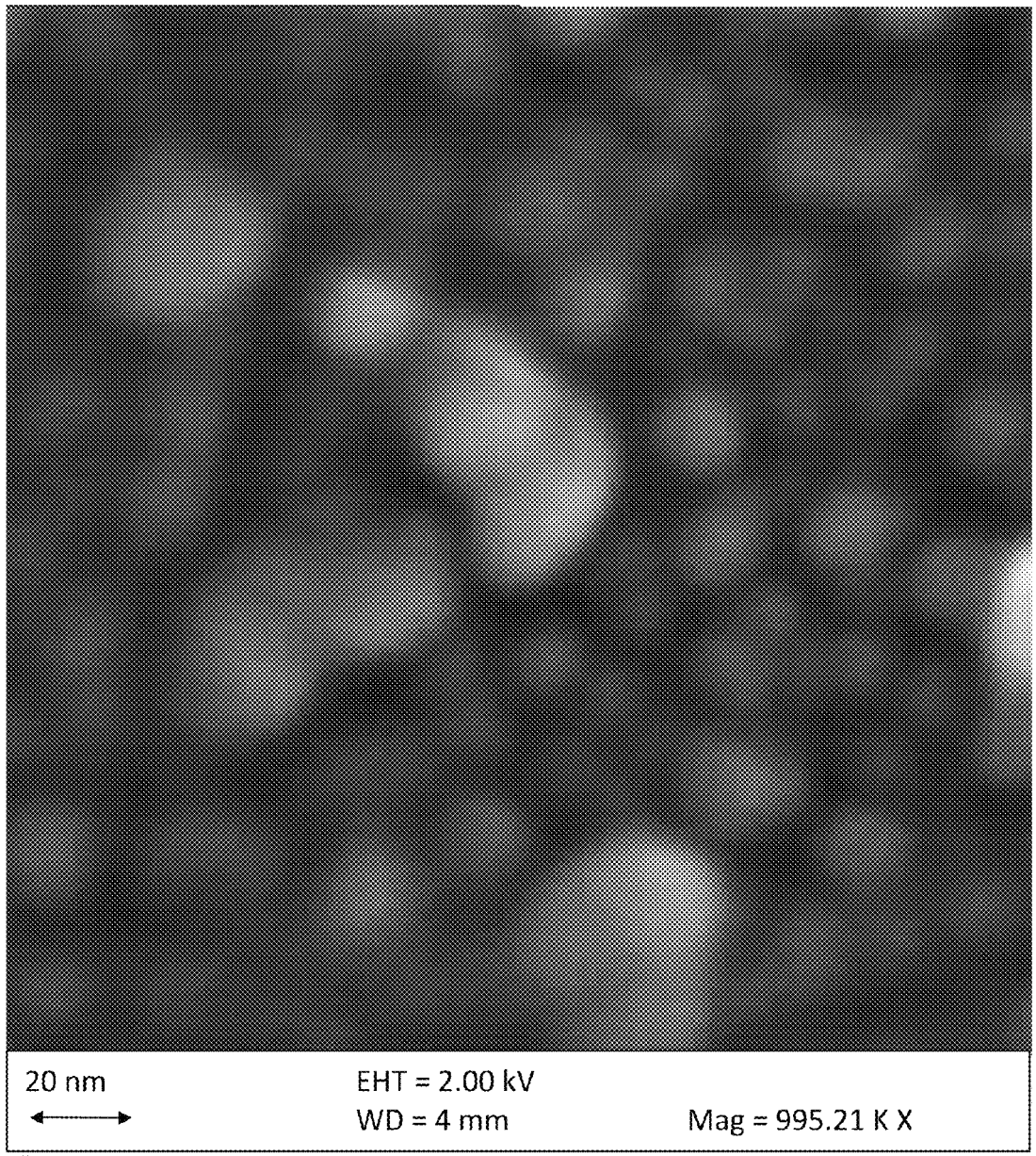

A ceramic film was deposited under the following conditions:
Solution: Methanol:Water=1:1 v/v, $TiCl_4$=0.002 M, $H_2O_2$=0.01
Voltage: 5V, Electrode distance 2 cm, CD=20 mA/cm², Time 140 s The process produced a 550-nm thick film, which is shown in the photomicrographs of FIGS. 3A, 3B, and 3C at varying magnifications.

Example 2

Figure 4A:
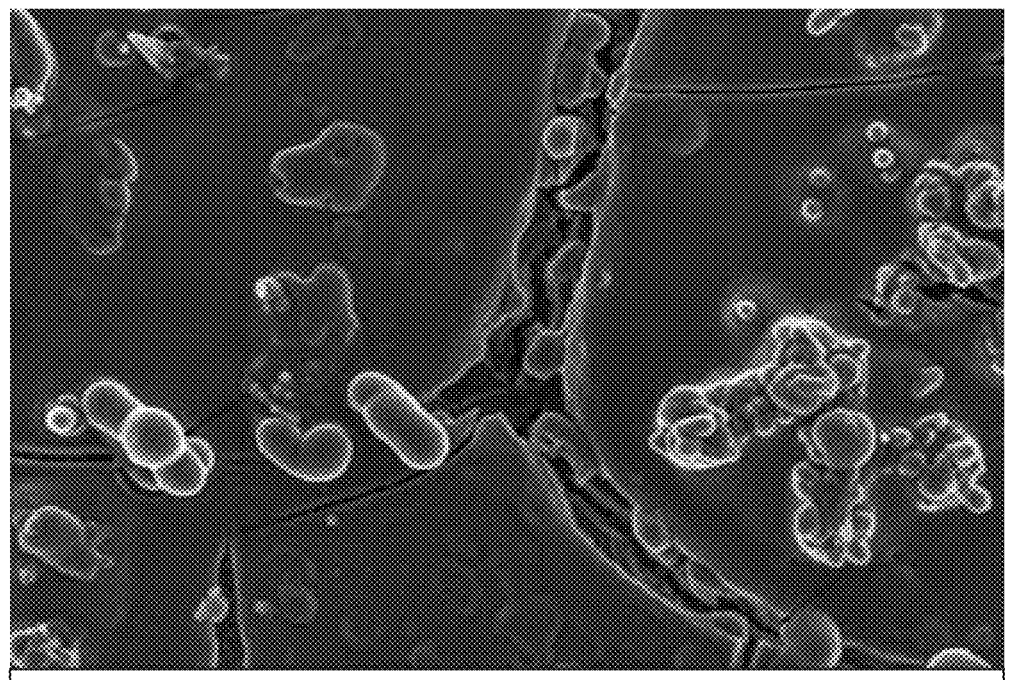
FIGS. 4A and 4B show electron micrographs of a 2,000 nm thick titania film under various magnifications.
Figure 4B:
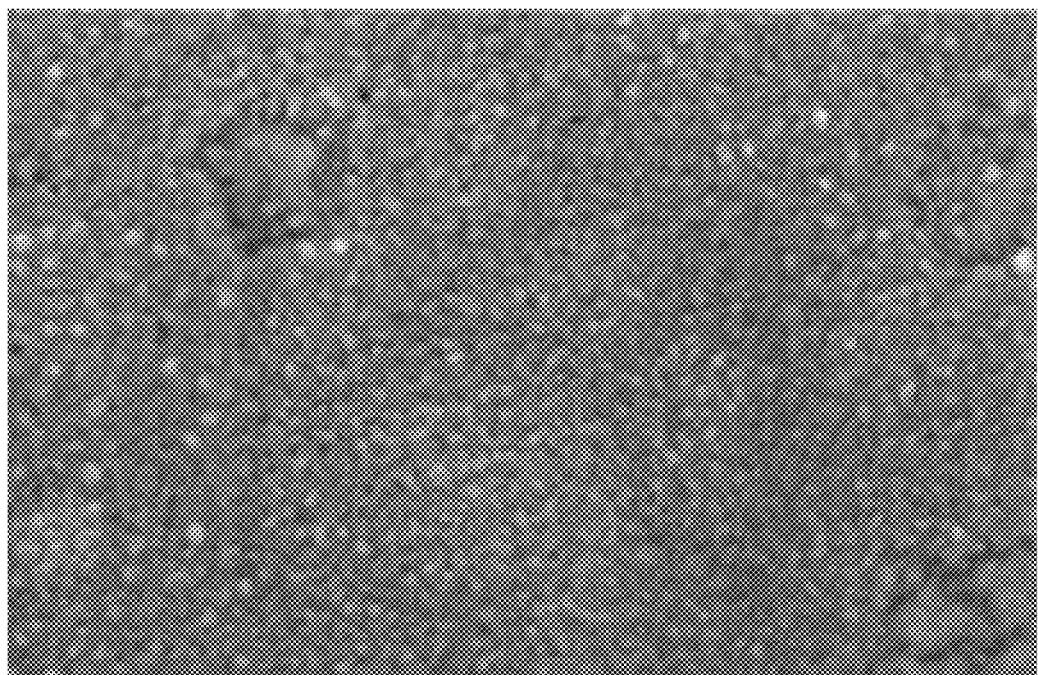

A ceramic film was deposited under the following conditions:
Solution: Methanol:Water=1:1 v/v, $TiCl_4$=0.02 M, $H_2O_2$=0.2
Voltage: 10V, Electrode distance 2 cm, CD=100 mA/cm², Time 120 s The process produced a 2000-nm thick film, which is shown in the photomicrographs of FIGS. 4A, 4B, and 4C at varying increasing magnifications.

Example 3

Figure 5A:
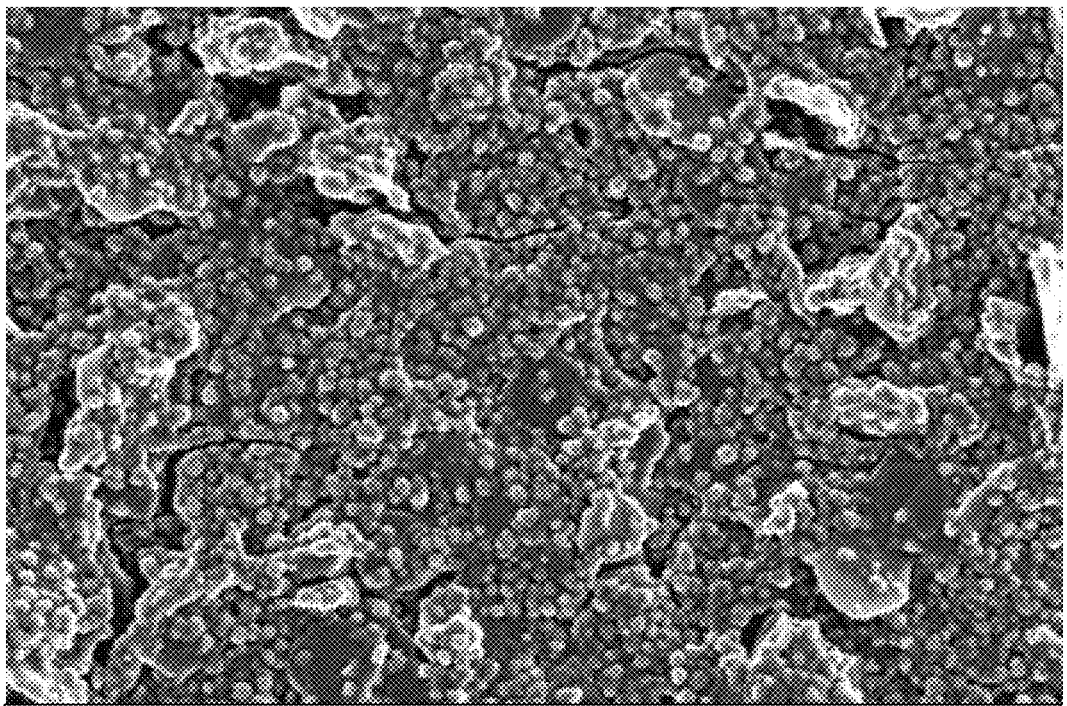
FIGS. 5A, 5B and 6A, 6B and 6C, respectively show electron micrographs comparing titania films formed with and without hydrogen peroxide on the solution.
Figure 5B:
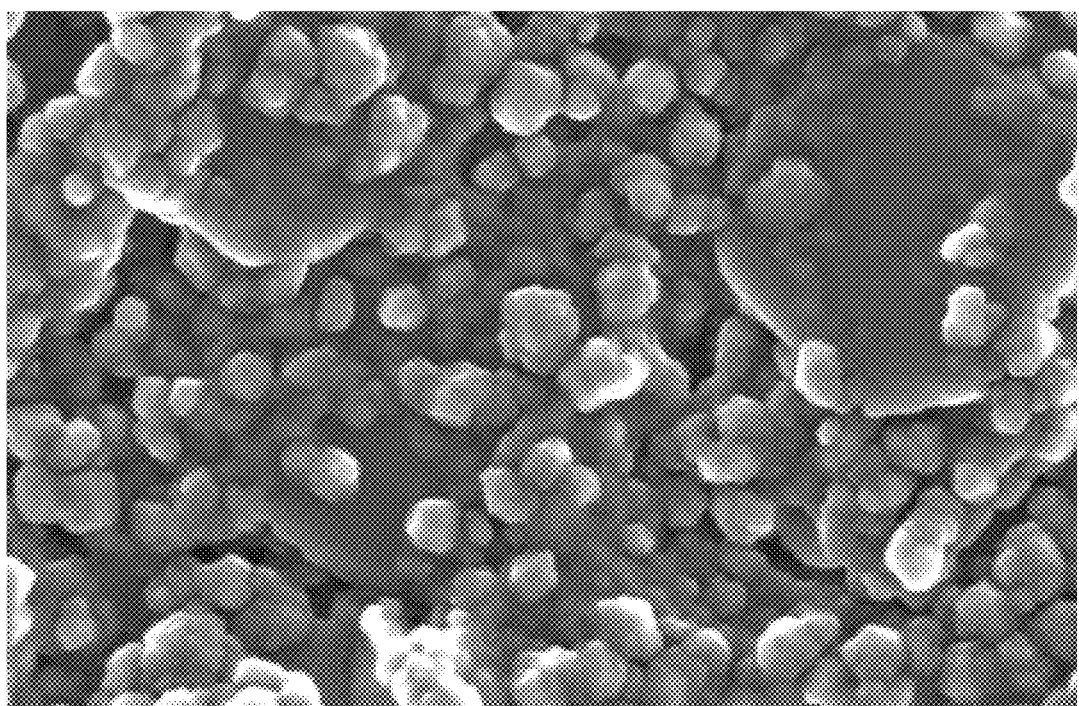

A deposition of titania films on commercial copper/FR4/copper laminates was conducted under the following conditions:
Solution: Methanol:Water=95:5 v/v, $TiCl_4$=0.02 M, $H_2O_2$=0.1 M
Voltage: 10V, Electrode distance 2 cm, CD=100 mA/cm², Time 20/20/20 s (three 20 second intervals). Multiple deposition periods were adopted to reduce through-the-layer cracks. Electron micrographs of the resultant films are shown in FIGS. 5A and 5B, at varying magnification.

Example 4

Figure 6A:
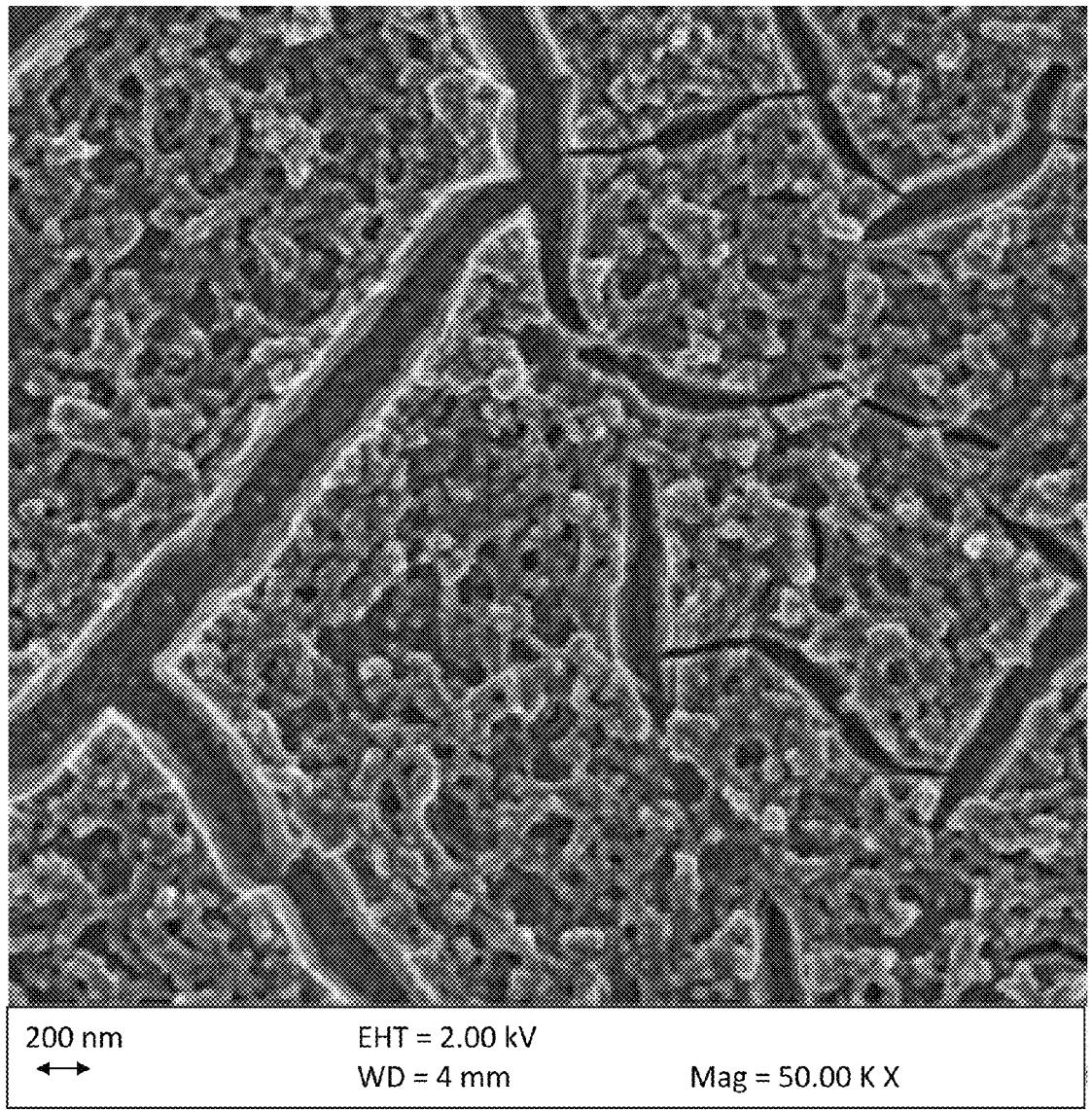
Figure 6B:
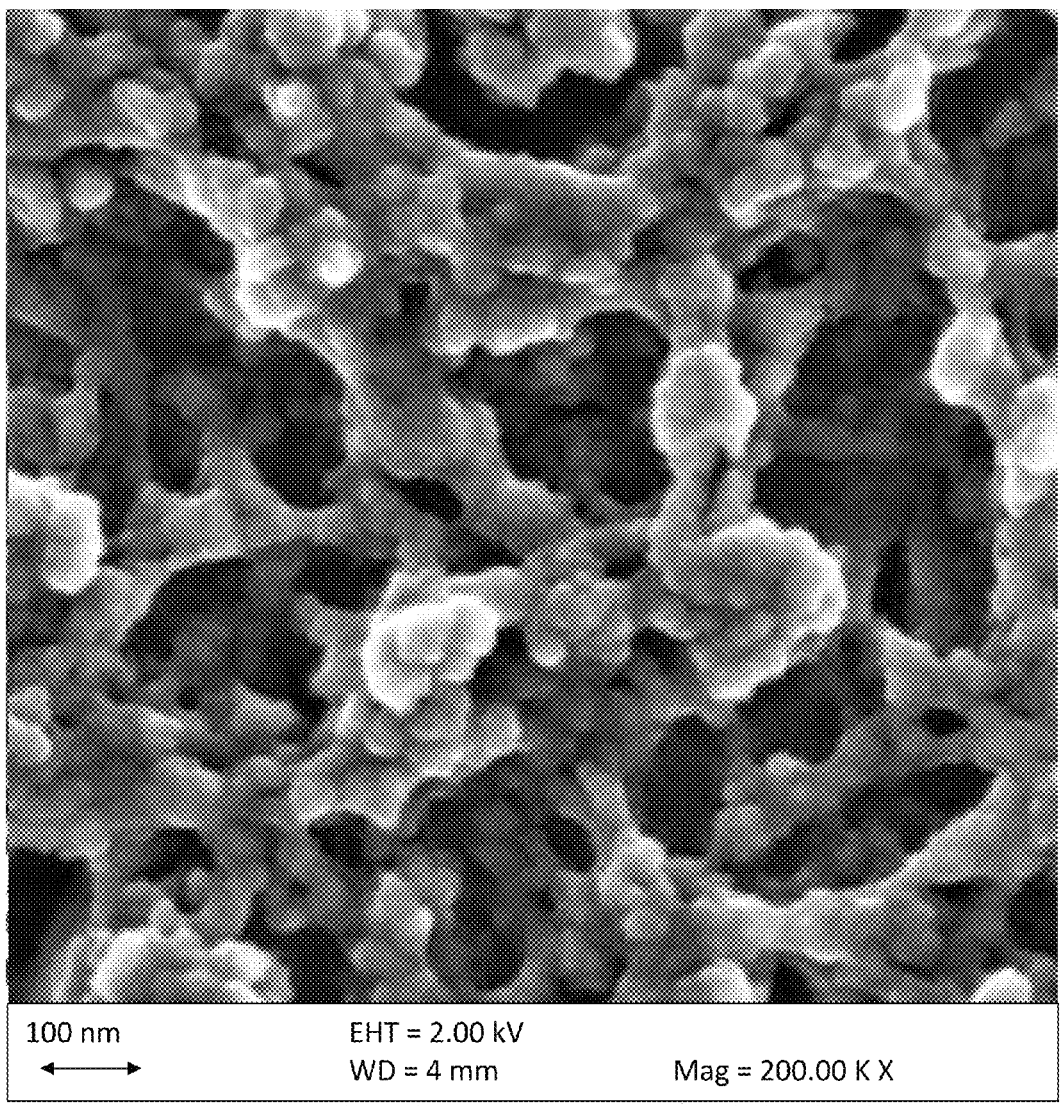
Figure 6C:
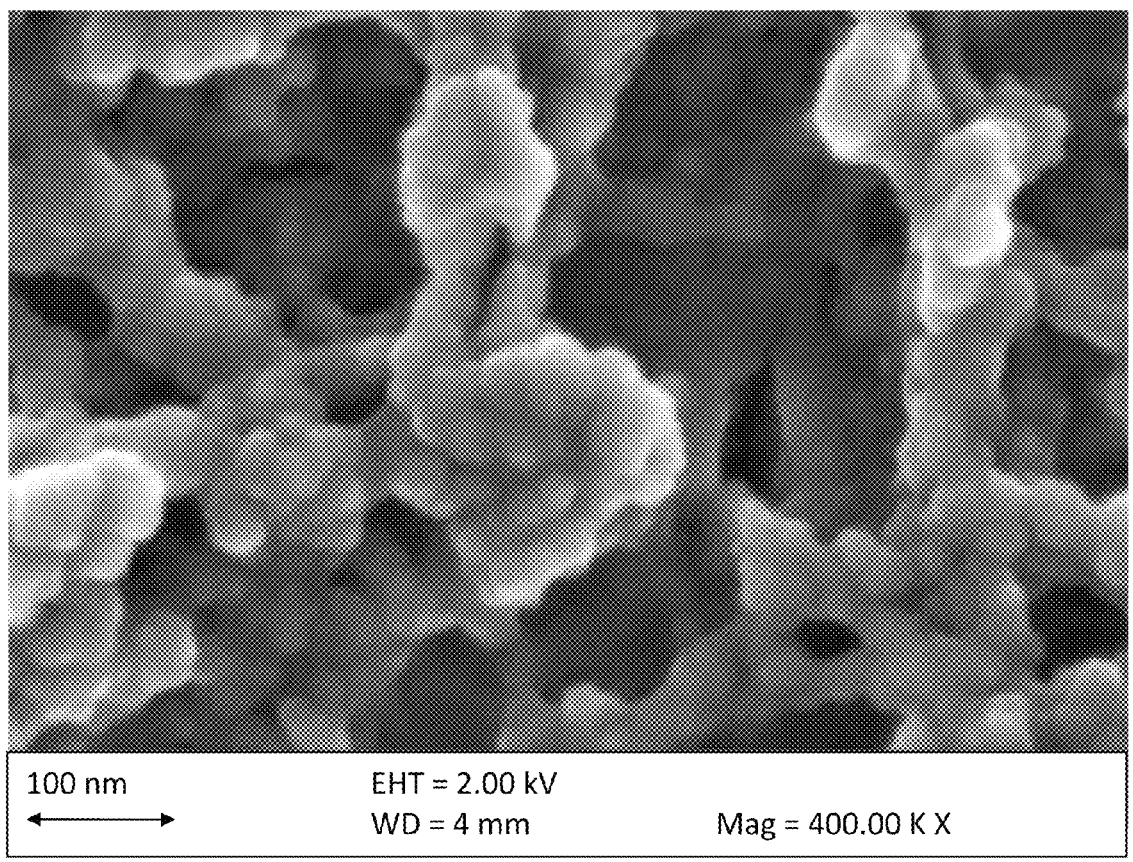

A deposition was conducted of titania films on 500 nm thick copper sputtered on a polyimide (PI) surface under the following conditions:
Solution: Methanol:Water=95:5 v/v, $TiCl_4$=0.02 M. (without $H_2O_2$ in the electrolyte.)
Voltage: 10V, Electrode distance 2 cm, CD=15 mA/cm², Time 120 s The process, which did not use hydrogen peroxide, produces a very porous structure, with evident cracking at lower magnifications, as shown in FIGS. 6A, 6B and 6C.

Example 5

Figure 7A:
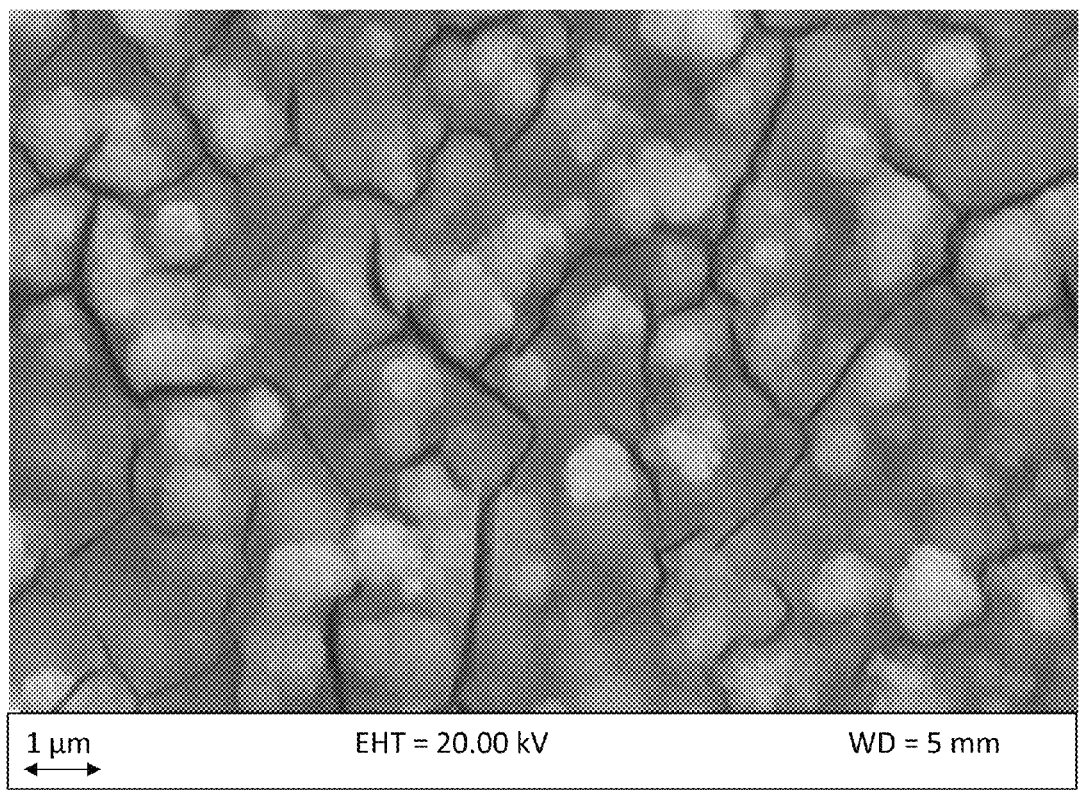
FIGS. 7A and 7B, and 8A and 8B show, respectively comparative electron micrographs and X-ray spectrographs of titania films formed in methanol-water and water solutions, respectively.
Figure 7B:
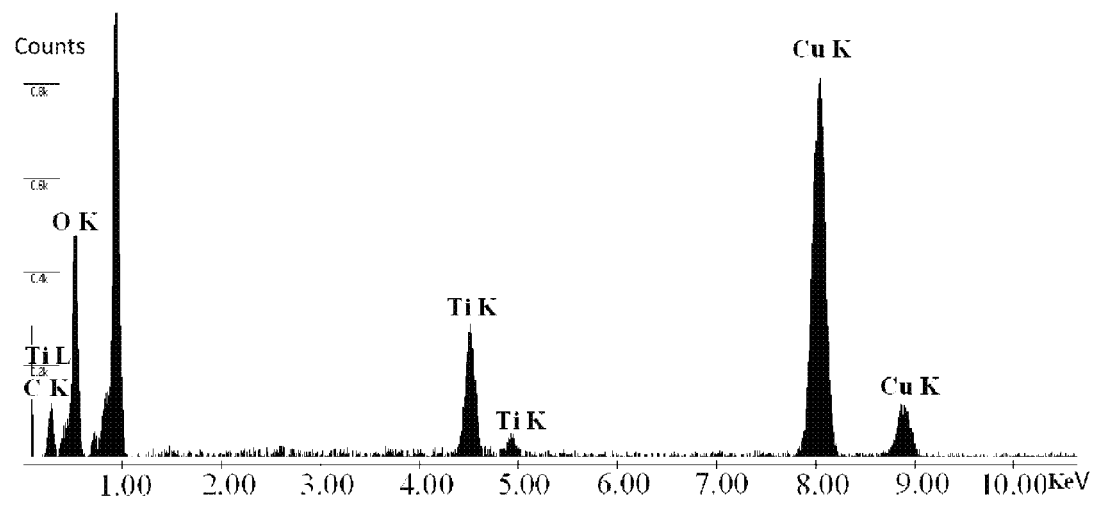
Figure 8A:
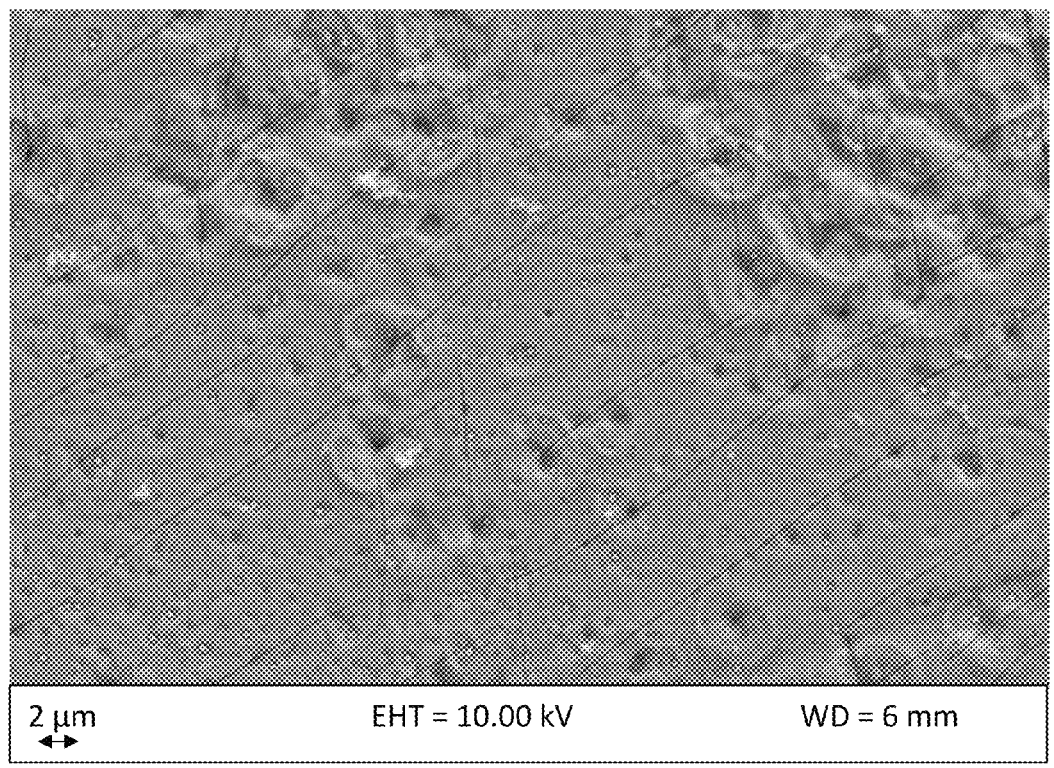
Figure 8B:
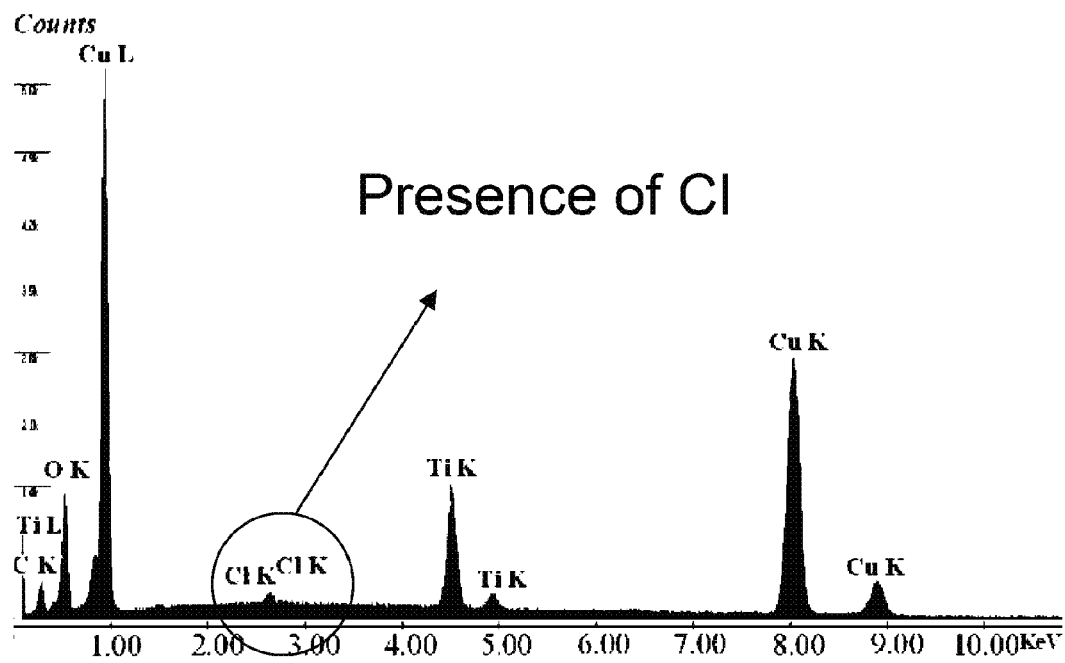

The effect of methanol on titania film deposition was investigated. FIG. 7A shows a micrograph of a titania film formed in methanol+water, while FIG. 8A shows a corresponding film formed in water without methanol. FIGS. 7B and 8B show X-ray spectrograms of samples formed in a solution of [$TiCl_4$]=0.004M, [$H_2O_2$]=0.02M, wherein chloride peaks are evident in the water solution process that are not evident in the water-methanol process.

Example 6

Titania films formed using the conditions specified had the following properties:

TABLE 1

| Sample | 1 | | 2 | | 3 | |
|---|---|---|---|---|---|---|
| Solution conditions | $CH_3OH$:$H_2O$ = 95:5 $TiClO_4$ 0.02M $H_2O_2$ 0.1M | | $CH_3OH$:$H_2O$ = 95:5 $TiClO_4$ 0.01M $H_2O_2$ 0.05M | | $CH_3OH$:$H_2O$ = 95:5 $TiClO_4$ 0.02M $H_2O_2$ 0.1M | |
| Deposition conditions | 10 V, 20/20/20/20/20 s | | 10 V, 20/20 s | | 7 V, 20/20/20/20 s | |
| Thickness (µm) | 2 | | 1.5 | | 1 | |
| Area × 10⁶ (m²) | 0.8945 | 1.445 | 0.99 | 1.314 | 1.22 | 0.8959 |
| Capacitance (nF) | 0.166 | 0.327 | 0.192 | 0.249 | 0.671 | 0.313 |
| Capacitance/Area (nF/sq. in) | 120 | 146 | 126 | 123 | 355 | 225 |
| Dielectric constant | 40 | 53 | 33 | 33 | 62 | 39 |

Using an HP Impedance analyzer and Agilent 34405A DMM for capacitance measurement, the following results were obtained:

TABLE 2

|  |  |  | Sample 1 |  | Sample 2 |  |
|---|---|---|---|---|---|---|
| Thickness (μm) |  |  | 2 |  | 1.5 |  |
| Area × $10^6$ ($m^2$) |  |  | 0.8945 |  | 1.445 |  |
| Capacitance (nF) | 100 | kHz | 0.124 | 0.249 | 0.142 | 0.217 |
| Capacitance (nF) | 1 | MHz | 0.082 | 0.176 | 0.104 | 0.156 |
| Dielectric loss | 100 | kHz | 0.0043 | 0.004 | 0.005 | 0.0069 |
| Dielectric loss | 1 | MHz | 0.51 | 0.52 | 0.64 | 0.67 |
| Capacitance/Area (nF/sq. in) | 100 | kHz | 89.50 | 111.21 | 92.50 | 106.52 |
| Capacitance/Area (nF/sq. in) | 1 | MHz | 59.16 | 78.60 | 67.75 | 76.58 |
| Dielectric constant | 100 | kHz | 31.31 | 38.92 | 24.29 | 27.97 |
| Dielectric constant | 1 | MHz | 20.70 | 27.51 | 17.80 | 20.11 |

Example 7

A barium salt ($BaCl_2$), is added to the solution to provide $Ba^{2+}$ ions. Titanium precursor solution ($TiCl_4$) as well as $TiO_2$ particles are converted to barium titanate ($BaTiO_3$) in the barium-salt containing solution of higher pH. It is noted that the high pH solution is normally corrosive to the copper substrate.

The general reaction is:

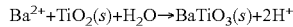

$$Ba^{2+} + TiO_2(s) + H_2O \rightarrow BaTiO_3(s) + 2H^+$$

Figure 9:
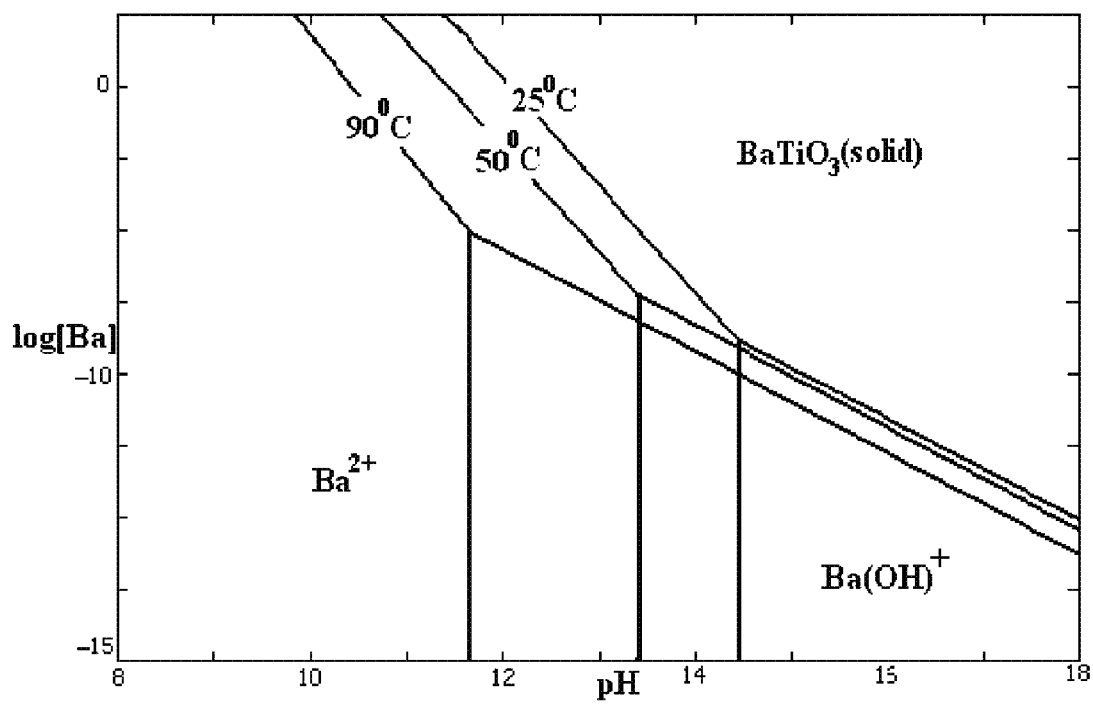
FIG. 9 shows a stability diagram for Barium Titanate, comparing log [$Ba^{2+}$] and pH with respect to the various products in solution.

The phase diagram of this solution is shown in FIG. 9, which shows that higher [$Ba^{2+}$] and higher pH favor formation of $BaTiO_3$. Mild heating of between 55-80° C. speeds the reaction. This high pH is, however, corrosive to the copper layer.

Figure 10:
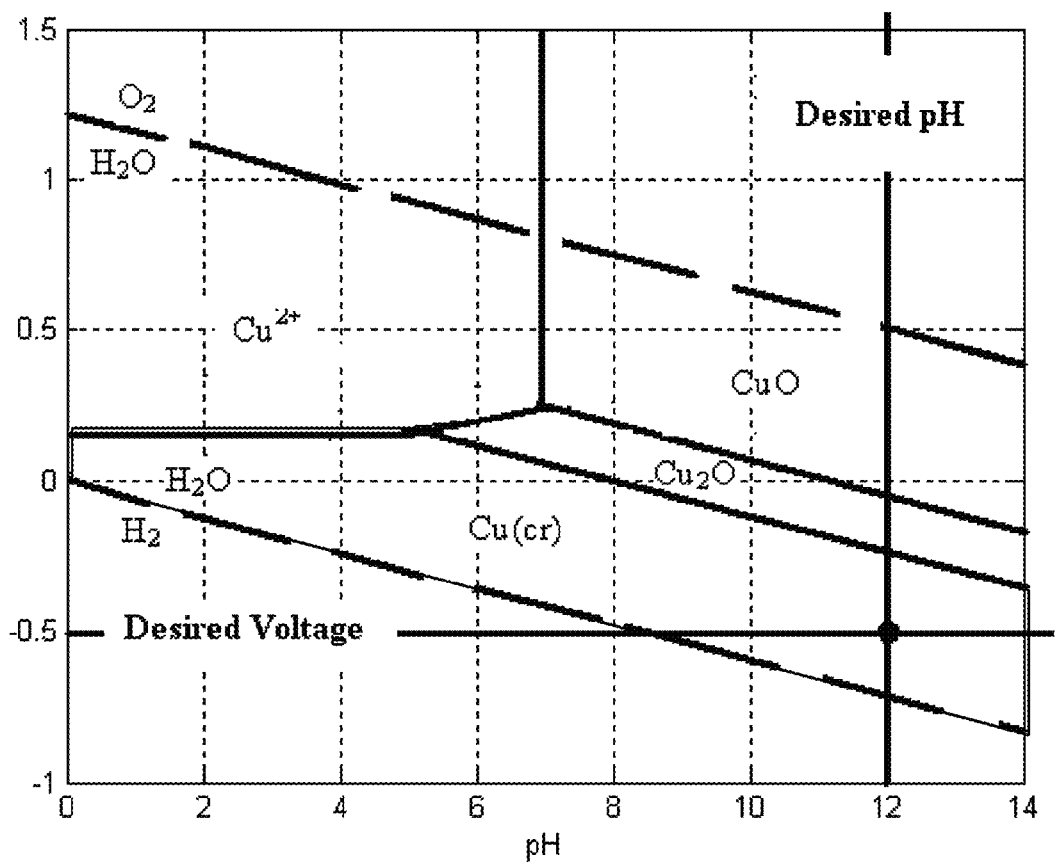
FIG. 10 shows an $E_H$-pH diagram of the Cu—$O_2$—$H_2O$ system ([$Cu^{2+}$]~$10^{-6}$ M) at room temperature, showing a range available for electrochemical protection of a copper substrate.

The copper layer, however, may be protected by application of an electrochemical bias. FIG. 10 shows an $E_H$-PH graph for the Cu—$O_2$—$H_2O$ system, relevant during the conversion of titania to barium titante. At a pH of 12, a voltage bias of about −0.5V is required to maintain copper in the reduced state, with no considerable oxidation. Greater negative bias voltages will cause hydrolysis of water and generation of hydrogen, which will cause the titania film to peel off of the copper.

Example 8

Original titania films are made from multiple deposition cycles of 20-40-20-10 s. The resulting film thickness is 1.5 micron. The resulting film sample was treated with 0.01M $BaCl_2$ aqueous solution, with the pH maintained at 12.3 with 5 M KOH. The process was conducted at a temperature of 75° C. The resultant film had the following properties:

TABLE 3

|  | Original Titania Sample |  | Converted Sample 1 |  | Converted Sample 2 |  |
|---|---|---|---|---|---|---|
| Thickness (μm) | 1.5 |  | 1.5 |  | 1.5 |  |
| Area * $10^6$ ($m^2$) | 0.8459 | 1.2347 | 0.6570 | 1.2045 | 0.7173 | 1.1845 |
| Capacitance (nF) | 0.167 | 0.242 | 0.211 | 0.401 | 0.231 | 0.385 |
| C/A (nF/sq. in | 127.38 | 126.43 | 207.27 | 214.78 | 207.73 | 209.69 |
| Dielectric constant | 33.5 | 33.2 | 54.1 | 56.34 | 54.67 | 55.13 |

$TiO_2$ thin films were thus fabricated on copper substrates during a low-temperature (room temperature) process for producing embedded capacitors.

The process parameters, e.g., temperature, voltage, solution composition, pH, etc., are derived from thermodynamic calculations for protection of the metallic cathode, which is in a preferred embodiment copper, but may of course be another conductive material which is, for example, subject to corrosion in aqueous $TiCl_4$ or highly basic solutions.

Multiple deposition cycles are employed to avoid the "through-the-layer" cracks. Indeed, the process is generally controlled to produce a homogeneous film. On the other hand, it may be desirable to intentionally produce discrete layers, for example by selectively controlling conditions for each cycle, to produce a laminated structure of relatively homogeneous or heterogeneous composition. Further, in addition to changes in electric conditions over time, the solution may also be altered, to provide a heterogeneous layered structure and/or to permit post deposition transformation of a layer.

An optional SAM or other patterning layer may be provided on the cathode, to assist in organizing the deposited layers, though this is not required.

The process limits hydrogen evolution near the substrate, and results in good adhesion and dense microstructures.

The electrical performance of $TiO_2$ thin film capacitors produced using the process was as follows:

Capacitance density: >120 nF/$in^2$ (>59 nF/$in^2$ at 1 MHz) (cf. 10 nF/$in^2$ for commercially available ceramic particle polymer capacitors at 1 kHz)

Dielectric constant: >30 (>18 at 1 MHz).

Dielectric loss: <0.007 (at 100 kHz), <0.6 (at 1 MHz).

Breakdown voltage: >15 volts

The layer may be post-processed to transform the material. For example, a $TiO_2$ layer may be converted to $BaTiO_3$ by a conversion process. In thin Films, the obtained dielectric constant of $BaTiO_3$ is >50, which represents, for example, a 67% increase over the starting $TiO_2$ film material. The $TiO_2$ film is converted to $BaTiO_3$ at 55° C., pH=11.5-12.5 by 0.01 M $BaCl_2$ in aqueous solution. This process generates acid ($H^+$) near the cathode, and therefore the solution is titrated with KOH to maintain pH within the desired range during the process.

It is this seen that the present invention provides a method for forming films on a substrate susceptible to corrosion during film-formation or processing, which comprises providing electrodic protection of the substrate from corrosion, and limiting electrolysis of water near the substrate to improve film adhesion to the substrate. The film is preferably a titanium based dielectric, and the forming solution is preferably a ceramic precursor salt and a peroxide in a methanol-water media. The dielectric may be patterned on the substrate using a self-assembling monolayer mask.

What is claimed is:

1. A method of forming a ceramic film on a substrate having a conductive surface, comprising:

immersing the substrate having the conductive surface in an aqueous solution, wherein the solution has at least one corrosive solute which is corrosive to the conductive surface, within a corrosive range of a composition of the solution and a corrosive voltage potential of the conductive surface with respect to a counter electrode in the solution;

applying a cathodic voltage potential on the conductive surface with respect to the counter electrode and controlling the composition of the solution by adding at least one ceramic precursor, sufficient to subject the conductive surface to conditions outside the corrosive range to thermodynamically protect the conductive surface from corrosion by the corrosive solute, and to drive formation of the ceramic film on the conductive surface through at least one electrochemical oxidation reaction of the at least one ceramic precursor; and maintaining the cathodic voltage potential and composition of the solution outside of the corrosive range to promote formation of the ceramic film on the conductive surface while limiting an extent of at least one corrosive electrochemical reaction of the corrosive solute proximate to the conductive surface, and limiting hydrolysis of water within the aqueous solution to reduce peeling of the ceramic film from the conductive surface for a sufficient duration to produce a desired thickness of the ceramic film on the conductive surface while preserving the conductive surface;

wherein the conductive surface comprises metallic copper;

wherein the ceramic film comprises titanium dioxide;

wherein the solution comprises hydrogen peroxide;

wherein the at least one ceramic precursor comprises titanium tetrachloride; and wherein the cathodic voltage potential is between −5V and −10V.

2. The method according to claim 1, wherein the conductive surface is cathodically protected by application of a negative bias voltage with respect to a reference electrode in solution and a pH of the solution proximate to the conductive surface is maintained.

3. The method according to claim 1, wherein the solution comprises between about 50% and 95% methanol.

4. The method according to claim 1, wherein the solution comprises methanol-water-hydrogen peroxide solution.

5. The method according to claim 1, wherein the reactive solute comprises chloride ion.

6. The method according to claim 1, wherein the ceramic film forms a dielectric layer of a capacitor.

7. The method according to claim 1, wherein the formed ceramic film is subjected to a chemical reaction to form a modified ceramic film having a dielectric constant greater than a respective dielectric constant of the ceramic film.

8. The method according to claim 7, wherein the chemical reaction comprises reacting the formed ceramic film with an ionic solution, while controlling a pH proximate to the formed ceramic film and the cathodic voltage potential of the conductive substrate with respect to a reference electrode in the solution.

9. The method according to claim 8, wherein the ionic solution comprises barium, and the modified ceramic film having increased dielectric constant comprises barium titanate.

10. The method according to claim 1, further comprising forming a conductive layer over the ceramic film, to thereby sandwich the ceramic film between the conductive layer and the conductive surface.

11. The method according to claim 1, wherein a self-assembling monolayer is formed on the conductive surface to influence a deposition of the ceramic film.

12. The method according to claim 1, wherein the ceramic film is electrically conductive and acts as an electrically resistive material between the conductive surface and an electrode adjacent to the ceramic film.

13. The method according to claim 1, wherein the electrochemical reaction comprises a hydrolytic production of hydrogen.

14. The method according to claim 1, wherein the ceramic film is formed to thickness of greater than about 0.5 microns.

15. The method according to claim 1, wherein the maintaining step is conducted under a maximum process temperature of less than about 100° C.

16. The method according to claim 1, further comprising the step of altering the cathodic voltage potential over time.

17. The method according to claim 1, wherein the cathodic voltage potential is applied for an aggregate of between about 20 and 140 s to form the ceramic film.

18. The method according to claim 1, wherein the corrosive solute comprises a halide ion.

19. The method according to claim 1, wherein the thermodynamic protection comprises maintaining a cathodic voltage potential and a pH proximate to the conductive surface within a range determined by thermodynamic analysis to maintain the conductive surface in a reduced state.

20. The method according to claim 1, wherein the ceramic film comprises at least one of tin, indium, zinc, and barium.

21. The method according to claim 1, further comprising masking a portion of the conductive surface to selectively define a ceramic film deposition region.

22. The method according to claim 1, further comprising forming a series of ceramic film layers on the conductive surface.

23. The method according to claim 1, wherein the ceramic film has a resistivity of between about 25 and 100 Ohms per square.

24. The method according to claim 1, wherein the ceramic film has a dielectric constant of at least 17.

25. The method according to claim 1, wherein the ceramic film has a breakdown voltage of at least 15V.

26. A method of forming a ceramic film on a substrate having a conductive surface, comprising:

providing at least one conductive surface portion on a substrate, subject to corrosion by at least one component of a solution containing at least one ceramic film precursor;

immersing the substrate having the conductive surface portion in the solution;

forming the ceramic film on the substrate from the at least one ceramic film precursor, by applying a voltage potential to the conductive surface with respect to a counter electrode in the solution and converting at least one ceramic film precursor through an electrochemical reaction involving an oxidation of the at least one ceramic film precursor, for a sufficient time to promote formation of the film to a desired thickness, wherein the at least one film precursor is consumed and at least on byproduct generated in the solution; and thermodynamically limiting corrosion of the conductive surface resulting from at least one reaction with the solution proximate to the conductive surface, by at least concurrently controlling:

the applied voltage potential within a protective range that cathodically protects the conductive surface from corrosion by the at least one component and limits hydrolysis of the solution to reduce peeling of the ceramic film from the conductive surface, and a composition of the solution proximate to the conductive surface over time to at least partially compensate for a change in composition of the solution;

wherein the conductive surface comprises metallic copper;

wherein the ceramic film comprises titanium dioxide;

wherein the solution comprises hydrogen peroxide;

wherein the at least one ceramic film precursor comprises titanium tetrachloride; and wherein the voltage potential is between −5V and −10V.

27. A method for forming an electrically functional ceramic film on a conductive substrate having a surface subject to corrosion by soluble metal salts, comprising:

immersing a substrate having a conductive portion in a solution comprising a soluble electrically functional ceramic film precursor comprising at least one soluble metal salt and a peroxide;

applying a cathodic voltage potential to the conductive portion with respect to a counter electrode in the solution and controlling a composition of the solution, sufficient to thermodynamically protect the conductive portion from corrosion by the at least one soluble metal salt, and drive formation of an electrically functional ceramic film on the conductive substrate through at least one oxidation reaction, while limiting a hydrogen gas evolution reaction proximate to the conductive portion to reduce peeling of the electrically functional ceramic film from the conductive portion; and maintaining the applied cathodic voltage potential and controlling the composition of the solution proximate to the conductive surface for a sufficient duration to produce an electrically functional ceramic film adherent on the conductive portion substantially without corrosion of the conductive portion;

wherein the conductive portion comprises metallic copper;

wherein the ceramic film comprises titanium dioxide;

wherein the peroxide comprises hydrogen peroxide;

wherein the at least one soluble metal salt comprises titanium tetrachloride; and wherein the cathodic voltage potential is between −5V and −10V.

28. A method for forming functional film of a resistor or semiconductor on a portion of a substrate having a surface subject to corrosion by soluble metal salt ceramic precursors, comprising:

providing a substrate having a substrate portion;

depositing a resistive or semiconductive material ceramic film from a solution comprising a metal ion source and a peroxide on the substrate portion, by applying a cathodic voltage potential to the substrate portion with respect to a counter electrode in the solution, sufficient to protect the substrate portion from corrosion by the solution, and to drive formation of the resistive or semiconductive material ceramic film on the substrate portion through at least one oxidation reaction, while concurrently controlling a pH and limiting an extent of hydrolytic generation of hydrogen proximate to the substrate portion sufficient to reduce peeling of the resistive or semiconductive material ceramic film from the substrate portion after formation; and forming a conductive portion on an exposed surface of the resistive or semiconductive material film;

wherein the substrate comprises metallic copper;

wherein the ceramic film comprises titanium dioxide;

wherein the peroxide comprises hydrogen peroxide;

wherein the metal ion source comprises titanium tetrachloride; and wherein the cathodic voltage potential is between −5V and −10V.

29. A method of converting a titania film to a barium titanate film, comprising:

immersing a substrate having a titania film formed on conductive portion in a solution comprising a barium salt; and applying a voltage potential to the conductive portion with respect to a counter electrode in the solution and a maintaning pH of the solution within a protective range which protects the conductive portion from corrosion by the solution which would otherwise occur under conditions of a voltage potential or a pH outside of the protective range, while limiting a production of hydrogen by hydrolysis proximate to the conductive portion to an extent sufficient to reduce peeling of the titania film from the conductive portion, to thereby permit conversion of the titania film to a barium titanate film; and wherein the voltage potential is about −0.5V; and wherein the pH is about 12.

30. The method according to claim 1, wherein the formed ceramic film is, or is transformed to be, a semiconductor.

31. The method according to claim 1, wherein the ceramic film is, or is transformed to be, a portion of a sensor.

* * * * *